United States Patent
Tatsumi et al.

(10) Patent No.: US 9,059,003 B2
(45) Date of Patent: Jun. 16, 2015

(54) POWER SEMICONDUCTOR DEVICE, METHOD OF MANUFACTURING THE DEVICE AND BONDING WIRE

(71) Applicants: NIPPON MICROMETAL CORPORATION, Iruma-Shi, Saitama (JP); WASEDA UNIVERSITY, Tokyo (JP)

(72) Inventors: Kohei Tatsumi, Tokyo (JP); Takashi Yamada, Iruma (JP); Daizo Oda, Iruma (JP)

(73) Assignees: NIPPON MICROMETAL CORPORATION, Iruma-Shi (JP); WASEDA UNIVERSITY, Tokyo (JP)

( * ) Notice: Subject to any disclaimer, the term of this patent is extended or adjusted under 35 U.S.C. 154(b) by 0 days.

(21) Appl. No.: 14/364,555
(22) PCT Filed: Feb. 22, 2013
(86) PCT No.: PCT/JP2013/054524
§ 371 (c)(1),
(2) Date: Jun. 11, 2014
(87) PCT Pub. No.: WO2013/129253
PCT Pub. Date: Sep. 6, 2013

(65) Prior Publication Data
US 2014/0327018 A1  Nov. 6, 2014

(30) Foreign Application Priority Data
Feb. 27, 2012 (JP) ................................. 2012-040116

(51) Int. Cl.
*H01L 23/00* (2006.01)
(52) U.S. Cl.
CPC ............... *H01L 24/05* (2013.01); *H01L 24/45* (2013.01); *H01L 2224/45124* (2013.01);
(Continued)
(58) Field of Classification Search
CPC .......... H01L 2224/45565; H01L 2224/45015; H01L 2224/45139; H01L 2224/73265; H01L 2224/48639; H01L 2224/48839; H01L 2224/05639; H01L 2224/05139
USPC .................... 257/777, 762; 438/656; 427/120; 174/126.2
See application file for complete search history.

(56) References Cited

U.S. PATENT DOCUMENTS

2004/0014266 A1* 1/2004 Uno et al. ..................... 438/200
2009/0072399 A1   3/2009 Terashima et al.
(Continued)

FOREIGN PATENT DOCUMENTS

JP  51-85669 A    7/1976
JP  61-234540 A  10/1986
(Continued)

OTHER PUBLICATIONS

International Search Report for PCT/JP2013/054524 mailed on May 14, 2013.

*Primary Examiner* — Roy Potter
(74) *Attorney, Agent, or Firm* — Birch, Stewart, Kolasch & Birch, LLP (57) ABSTRACT

It is an object of the present invention to provide a power semiconductor device, which is capable of being operable regardless of thermal stress generation, reducing a heat generation from wire, securing the reliability of bonding portion when the device is used for dealing with a large amount current and/or under a high temperature atmosphere, a method of manufacturing the device and a bonding wire. In a power semiconductor device in which a metal electrode (die electrode 3) on a power semiconductor die 2 and another metal electrode (connection electrode 4) are connected by metal wire 5 using wedge bonding connection, the metal wire is Ag or Ag alloy wire of which diameter is greater than 50 μm and not greater than 2 mm and the die 3 has thereon one or more metal and/or alloy layers, each of the layer(s) being 50 Å or more in thickness and a metal for the layer is selected from Ni, Cr, Cu, Pd, V, Ti, Pt, Zn, Ag, Au, W and Al.

24 Claims, 1 Drawing Sheet

(52) U.S. Cl.
CPC ........... *H01L 2224/45147* (2013.01); *H01L 2224/48091* (2013.01); *H01L 2224/48472* (2013.01); *H01L 2924/01047* (2013.01); *H01L 2224/05624* (2013.01); *H01L 2224/05647* (2013.01); *H01L 2224/45015* (2013.01); *H01L 2224/45139* (2013.01); *H01L 2224/45144* (2013.01); *H01L 2224/48227* (2013.01); *H01L 2924/10272* (2013.01); *H01L 2224/45565* (2013.01); *H01L 2224/45572* (2013.01); *H01L 2224/45618* (2013.01); *H01L 2224/45639* (2013.01); *H01L 2224/45644* (2013.01); *H01L 2224/45647* (2013.01); *H01L 2224/45655* (2013.01); *H01L 2224/45664* (2013.01); *H01L 2224/45666* (2013.01); *H01L 2224/45669* (2013.01); *H01L 2224/45671* (2013.01); *H01L 2224/45684* (2013.01); *H01L 2224/45672* (2013.01); H01L 24/03 (2013.01); H01L 24/43 (2013.01); *H01L 2224/04042* (2013.01); *H01L 2224/05007* (2013.01); *H01L 2224/05618* (2013.01); *H01L 2224/05639* (2013.01); *H01L 2224/05644* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05672* (2013.01); *H01L 2224/05684* (2013.01); *H01L 2224/45005* (2013.01); H01L 24/48 (2013.01); *H01L 2224/05082* (2013.01); *H01L 2224/05118* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05172* (2013.01); *H01L 2224/05184* (2013.01); *H01L 2224/45611* (2013.01); *H01L 2224/78313* (2013.01); *H01L 2224/85207* (2013.01); *H01L 2924/20103* (2013.01); *H01L 2924/13055* (2013.01); *H01L 2924/1305* (2013.01)

(56) References Cited

U.S. PATENT DOCUMENTS

2010/0282495 A1\* 11/2010 Uno et al. .................. 174/126.2
2011/0120594 A1\* 5/2011 Uno et al. ....................... 148/23

FOREIGN PATENT DOCUMENTS

| JP | 62-150836 A | 7/1987 |
|---|---|---|
| JP | 63-46738 A | 2/1988 |
| JP | 9-275120 A | 10/1997 |
| JP | 11-186314 A | 7/1999 |
| JP | 11-243111 A | 9/1999 |
| JP | 2000-195892 A | 7/2000 |
| JP | 2001-308134 A | 11/2001 |
| JP | 2003-303845 A | 10/2003 |
| JP | 2007-123597 A | 5/2007 |
| JP | 2008-174779 A | 7/2008 |
| JP | 2008-198977 A | 8/2008 |
| JP | 2009-33127 A | 2/2009 |

\* cited by examiner

POWER SEMICONDUCTOR DEVICE, METHOD OF MANUFACTURING THE DEVICE AND BONDING WIRE

CROSS REFERENCE TO RELATED APPLICATIONS

This non-provisional application is a National Stage entry under U.S.C. §371 of International Application No. PCT/JP2013/054524 filed on Feb. 22, 2013, which claims priority to Japanese Patent Application No. 2012-040116 filed in Japan on Feb. 27, 2012. The entire contents of all of the above applications are hereby incorporated by reference.

TECHNICAL FIELD

The present invention relates to a power semiconductor device, method of manufacturing the device and bonding wire used for the power semiconductor device.

BACKGROUND ART

A power semiconductor is a semiconductor used for controlling and/or supplying electric energy, for example, converting AC to DC, reducing voltage, etc. A power semiconductor deals with a large amount of current, as compared to an LSI, etc.

Power semiconductors are extensively used. Examples include controlling a variety of motors, power converter and uninterruptible power source. A power semiconductor device (power semiconductor module), in which a power semiconductor switching die, such as an IGBT (Insulated Gate Bipolar Transistor), GTO and power transistor is packaged, is known. These power semiconductor devices are applied to various inverter devices depending on their breakdown voltage and/or current capacity. To increase a capacity of the power semiconductor device, a plurality of power semiconductor dies may be arranged in parallel in a single power semiconductor device. A semiconductor die is defined here as a die where a semiconductor circuit is formed on a Si crystal or SiC crystal. A semiconductor device is defined as a device in which a semiconductor die is incorporated to form a package.

Figure 1:
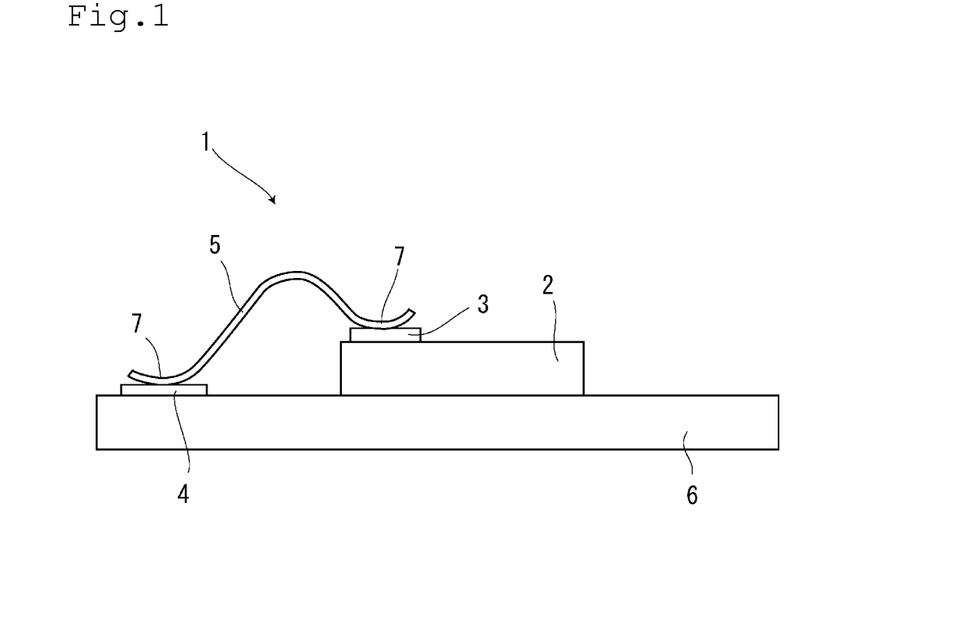
FIG. 1 is a schematic cross sectional view showing a structure of power semiconductor device.

FIG. 1 shows a schematic view of a cross section of a power semiconductor device 1. A power semiconductor die 2 has a metal electrode thereon. One end of a metal wire 5 is connected to the metal electrode, and the other end of the metal wire is connected to a lead frame of the power semiconductor device, an electrode on a substrate 6 or a metal electrode on another power semiconductor die among a plurality of power semiconductor dies being mounted to build a circuit. An intended metal electrode on the power semiconductor die 2 is referred to as a die electrode 3 and a metal die to be connected to the semiconductor die 3 is referred to as a connection electrode 4.

In a power semiconductor device, a heavy Al wire having a diameter of several hundred μm is used for the metal wire to have connection between electrodes (Patent Document 1). Although Cu wire is used for some LSIs as a metal wire, Cu wire is not used as a heavy wire for a power semiconductor device. Because Cu wire has high hardness and high work hardening coefficient, use of heavy wire likely damages a die electrode when a bonding connection is made by using ultrasonic waves. Au wire is frequently used for making ball bonding for LSI. However, as a heavy Au wire to be used for a power semiconductor device is very costly, it is hardly used for practical purposes.

Patent document 2 shows a bonding wire made of core material consisting of Ag or Ag alloy and an external coat thereon consisting of Au. Patent document 3 shows a bonding wire made of a core material containing Ag and a coating layer thereon containing Pd, Pt and/or Ni. However, the intended wire in both cases is 25 μm or not greater than 40 μm. Also as described in Patent document 2, Ag wire bonding with Al electrode causes significant amount of $Al_2Ag$ intermetallic compound to form. Because the intermetallic compound is so brittle that reliable bonding cannot be obtained, this prevents in particular Ag wire from being used for a power semiconductor device. Patent document 4 shows an example where Ag is used as a conductor for making a connection between an electrode and a pad in the power semiconductor module. However, the conductor and the pad and/or electrode are bonded with a solder, which is not intended to be applied to ball bonding and/or wedge bonding.

Patent document 5 also shows an example where an Au-based or Cu-based bonding wire connection or bonding ball is formed on an Au-based surface metal layer which is formed on a barrier metal film disposed on an Al-based or Cu-based bonding pad on a semiconductor chip which is a part of a semiconductor integrated circuit device. This prevents poor bonding, such as a Kirkendall void. However, this applies to Au wire or Cu wire bonding and is not intended for a power semiconductor device using a heavy wire.

When the power semiconductor device is modified to have a larger capacity, this leads to a large amount of current flow in a built-in power semiconductor die. When a large amount of current flows repeatedly in a power semiconductor die, the semiconductor die generates a lot of heat, and heat generated from a metal wire is considerable. This heat generation causes a temperature of the semiconductor die and the metal wire connected thereto to increase and decrease repeatedly. This causes thermal stress in a bonding part depending on the thermal expansion difference between members, and the thermal stress may cause a crack in the vicinity of the interface between the electrode and the metal wire.

In a recent power semiconductor device using a power semiconductor die with SiC substrate, it is said that an operation at high temperature of 250° C. or more can be made because the bandgap of SiC crystal is much larger than that of Si crystal. Thus, power semiconductor devices operable at high temperature have been studied. In such a power semiconductor device operable at high temperature, the thermal resistance of the device becomes more important than ever. As a melting point of conventional Al wire is relatively low, around 660° C., when it is used at high temperature, recrystallization occurs, which leads to forming a crack or void defect inside the wire and/or at an interface of the bonding part.

PRIOR ART DOCUMENTS

Patent Documents

Patent document 1: Japanese Unexamined Patent Application Publication No. 2002-314038
Patent document 2: Japanese Unexamined Patent Application Publication No. Hei 2-79439
Patent document 3: Japanese Unexamined Patent Application Publication No. 2004-14884
Patent document 4: Japanese Unexamined Patent Application Publication No. Hei 9-36186

Patent document 5: Japanese Unexamined Patent Application Publication No. 2010-157683

SUMMARY OF THE INVENTION

Problems to be Solved by the Invention

A conventional Al wire used as a metal wire for connections in a power semiconductor device has the advantage that bonding onto an Al electrode on a die by ultrasonic vibration can be easily made because of its low hardness at room temperature. Meanwhile, when a power semiconductor device is used for dealing with a large amount of current or under a high temperature atmosphere, its thermal resistance is not sufficient because the melting point is low, around 660° C., as mentioned above. Also as a specific resistance of Al is 2.7 $\mu\Omega\cdot cm$, belonging to the highest group in good conductors, heat generation from a large amount of current flow in the Al wire is considerable. Thermal stress may cause stress migration in Al, which leads to some defects. Also, resistance increases as the temperature increases, which may cause, particularly under high temperature, not only a defect brought from a grain growth and/or recrystallization of Al, but also a temperature higher than melting point, i.e., a meltdown of wire.

It is an object of the present invention to provide a power semiconductor device, which is capable of being operable regardless of thermal stress generation, reducing heat generation from a wire, securing the reliability of a bonding portion under a high temperature atmosphere, for example, 200° C. or more when the device is used for dealing with a large amount current and/or under a high temperature atmosphere, a method of manufacturing the device and a bonding wire used for a power semiconductor device.

Means to Solve the Problems

If Ag can be used as a material for a metal wire for the connection in a power semiconductor device, heat generation from the wire can be reduced if using a large amount of current, since the specific resistance of Ag, 1.6 $\mu\Omega\cdot cm$, is lower than that of Al, 2.7 $\mu\Omega\cdot cm$. Also, the melting point of Ag, 962° C., is much higher than that of Al, 660° C., which can improve the thermal resistance at high temperature. Ag, having a higher melting point than Al, can prevent defects by stress migration. Further, as deformability of Ag is higher than that of Cu, stress can be absorbed and resistance to breaking, such as a crack by thermal stress, is superior. Furthermore, compared to Cu wire, Ag has lower hardness at room temperature and lower work-hardening, which provides a low possibility of damage of a die electrode during the wire bonding process by ultrasonic waves.

Meanwhile, in the case of using an Al electrode as a die electrode, an intermetallic compound such as $Ag_2Al$ is formed on the interface when an Ag wire is bonded onto the Al electrode. As this intermetallic compound is so brittle and a void is formed at the position of the intermetallic compound, it is difficult to obtain a reliable bonding. Accordingly, particularly when using a heavy metal wire having a diameter of 50 $\mu m$ or more for a power semiconductor device, Ag wire cannot be used. In addition, if ball bonding is tried for bonding a heavy Ag wire onto an electrode, a good sphere-shaped ball cannot be formed in the atmosphere.

For this situation, the inventors discovered that the reliable bonding between the electrode and the wire can be secured even when Ag or Ag alloy wire is used as the metal wire, if the following electrode is used. That is, the electrode comprising a die electrode having thereon one or more layers, each of the layer(s) being 50 Å or more in thickness, consists of any one metal or an alloy made of two or more metals selected from the group consisting of Ni, Cr, Cu, Pd, V, Ti, Pt, Zn, Ag, Au, W and Al, wherein the die electrode and the layer or the layers adjacent to each other are different in their metal composition and the wire bonding is made by using a wedge bonding, not a ball bonding.

The present invention has been conceived based on consideration of the above knowledge and discovery and the summary is as follows.

(1) A power semiconductor device comprising:
a power semiconductor die,
a metal electrode on the power semiconductor die (hereinafter referred to as a die electrode); and
another metal electrode to be connected to the die electrode (hereinafter referred to as a connection electrode), wherein the die electrode and the connection electrode are connected with a metal wire by a wedge bonding connection; wherein the metal wire is Ag or Ag alloy wire of which a diameter is greater than 50 $\mu m$ and not greater than 2 mm and the die electrode has thereon one or more layers (hereinafter referred to as electrode coating layer(s)), each of the layer(s) being 50 Å or more in thickness, consisting of any one metal or an alloy made of two or more metals selected from the group consisting of Ni, Cr, Cu, Pd, V, Ti, Pt, Zn, Ag, Au, W and Al (hereinafter referred to as coating layer metal), wherein the die electrode and the electrode coating layer or the electrode coating layers adjacent to each other are different in their metal composition; wherein in the case where the die electrode is an Al electrode and an outermost surface layer of the electrode coating layer(s) is made of Ag, the die electrode has thereon, under the outermost surface layer of the electrode coating layer(s), one or more electrode coating layers each of which consists of any one metal selected from the coating layer metal except Ag or any alloy consisting of two or more metals selected from the coating layer metal, wherein the die electrode and the electrode coating layer or the electrode coating layers adjacent to each other are different in their metal composition.

(2) A power semiconductor device according to (1), wherein the Ag or Ag alloy wire is covered by a wire coating layer of which thickness is 30 Å or more, the wire coating layer contains one or more metals, an alloy including a metal, or an oxide or nitride of a metal, each of the metals is one selected from the group consisting of Pd, Au, Zn, Pt, Ni and Sn.

(3) A power semiconductor device according to (1) or (2), wherein connection between the Ag or Ag alloy wire and the die electrode and/or the connection electrode is made by using ultrasonic waves while temperature of either the wire or the electrode is kept at 60° C. or more.

(4) A power semiconductor device according to (2), wherein the wire coating layer on the surface of the wire is formed by a wet coating, a dry coating or a nano-particle metal deposited after the wire and the electrode are bonded.

(5) A power semiconductor device according to (1), (2), (3) or (4) wherein the power semiconductor die uses SiC semiconductor.

(6) A method of manufacturing a power semiconductor device according to (1) or (2), comprising:
making a connection between the Ag or Ag alloy wire and the die electrode and/or the connection electrode by using ultrasonic waves while keeping the temperature of either the wire or the electrode at 60° C. or more.

(7) A method of manufacturing a power semiconductor device according to (2) comprising: forming the wire coating layer on the surface of the wire by a wet coating, a dry coating or a nano-particle metal depositing after the wire and the electrode are bonded.

(8) A bonding wire for semiconductor connection comprising:

an Ag or Ag alloy wire covered by a wire coating layer, wherein a diameter of the wire is greater than 50 μm and not greater than 2 mm, the wire coating layer contains one or more metals, an alloy including a metal, or an oxide or nitride of a metal, each of the metals is one selected from the group consisting of Pd, Au, Zn, Pt, Ni and Sn.

(9) A bonding wire according to (8), wherein a thickness of the wire coating layer is ⅕ (one-fifth) or less of the diameter of the wire and 10 Å or more.

(10) A bonding wire according to (8) or (9), further comprising a diffusion layer of Ag and a metal contained in the wire coating layer between the wire coating layer and a base material of the wire, a thickness of the diffusion layer is 50 Å or more and 10 μm or less.

(11) A bonding wire according to (8), (9) or (10), wherein a residual resistance ratio of the bonding layer is 5 or more and 2000 or less.

(12) A bonding wire according to (8), (9), (10) or (11), wherein a breaking elongation of the bonding wire is 15% or more.

Effects of the Invention

In the present invention, reliable bonding between the electrode and the wire can be secured, heat generation from the metal wire when a large amount of current flows can be reduced and the thermal resistance at high temperature can be improved even when Ag wire is used, if the following power semiconductor device is used. That is, a power semiconductor device comprising a power semiconductor die, a metal electrode on the power semiconductor die (die electrode), and another metal electrode to be connected to the die electrode (connection electrode), wherein the die electrode and the connection electrode are connected with a metal wire by using a wedge bonding connection; wherein, the metal wire is Ag or Ag alloy wire of which a diameter is greater than 50 μm and not greater than 2 mm and the die electrode has thereon one or more layers (hereinafter referred to as an electrode coating layer), each of the layer(s) being 50 Å or more in thickness, consisting of any one metal or an alloy made of two or more metals selected from the group consisting of Ni, Cr, Cu, Pd, V, Ti, Pt, Zn, Ag, Au, W and Al (hereinafter referred to as a coating layer metal), wherein the die electrode and the electrode coating layer or the electrode coating layers adjacent to each other are different in their metal composition.

MODE FOR CARRYING OUT THE INVENTION

As a metal electrode on the power semiconductor die, Al electrode, Cu electrode, Ni electrode or Ti electrode can be used, with Al electrode preferred. First, an explanation is made for use of an Al electrode as a die electrode.

As described above, in the case where the Al electrode is used as the die electrode, an intermetallic compound such as $Ag_2Al$ is formed on the interface when the heavy Ag or Ag alloy wire having a diameter of 50 μm or more is bonded to the Al electrode. Since the intermetallic compound is so brittle and a void is formed at the position of the intermetallic compound, it is difficult to obtain a reliable bonding. In contrast, in the present invention, it is found that the reliable bonding between the electrode and the wire can be secured, even when a heavy Ag or Ag alloy wire having a diameter of 50 μm or more is used as the metal wire, if the following electrode is used. That is, an electrode comprising a die electrode having thereon one or more layers each of which is 50 Å or more in thickness and consisting of any one metal or an alloy made of two or more metals selected from the group consisting of Ni, Cr, Cu, Pd, V, Ti, Pt, Zn, Ag, Au, W and Al, wherein the die electrode and the electrode coating layer adjacent to each other are different in their metal composition and the wire bonding is made by using a wedge bonding.

As mentioned above, the die electrode and the electrode coating layer or the electrode coating layers which are adjacent to each other are different in their metal composition. This constitution means when one or more electrode coating layers are formed on the die electrode, a metal or metal composition of an alloy constituting the die electrode and the electrode coating layer adjacent to each other or the electrode coating layers adjacent to each other are different from each other, and therefore, the following structures are not included in that constitution, that is, for example, an electrode coating layer of Al, Cu, Ni or Ti is formed respectively on Al electrode, Cu electrode, Ni electrode or Ti electrode, or electrode coating layer(s) consisting of the same type coating layer metal or the alloy thereof as each other are superposed.

By forming an electrode coating layer consisting of coating layer metal or alloy of the coating layer metal on the surface of Al electrode, these metals, unlike Al electrode, can restrain the formation of an intermetallic compound at the bonding portion of Al and Ag having defects such as a void. Also ultrasonic bonding of these metals and Ag can form a diffusion layer at the relatively favorable bonding part. In the case where the bonding is disturbed because of the oxidation of the surface of these metals, it is effective to cover the surface with a noble metal, such as Pd, Au or Ag for preventing oxidation. In particular V, Ti, Cr or Ni provides a good adhesion and works well as a diffusion barrier between Ag and Al. Further Cu, Pd, Pt or Zn is suitable for improving the initial bondability with Ag. It is also effective to superpose the metal of layers to form a plural layer for securing the initial bondability and a long-term bonding reliability.

When the thickness of the electrode coating layer is 50 Å or more, aforementioned effects are produced. If the thickness is less than 50 Å, a defect may be formed in the electrode coating layer. Accordingly, when a plurality of electrode coating layers are superposed, each of the electrode coating layers is set to have a thickness of 50 Å or more. The thickness of the electrode coating layer is preferably 100 Å, more preferably 200 Å.

The upper limit of the thickness of electrode coating layer is preferably 5 μm. Thickness more than 5 μm can be a factor to provide electric resistance of the bonding portion with a variation in addition to raising the cost.

In the case where an electrode coating layer, consisting of Ag or Au as a coating layer metal constituting the outermost surface layer of the electrode coating layer(s), is used for Al electrode, the following constitution is preferable. That is, the electrode coating layer consisting of Ag or Au is not directly applied to the Al electrode but one or more electrode coating layers, each of which consists of any one metal selected from the coating layer metal except Ag, that is, Ni, Cr, Cu, Pd, V, Ti, Pt, Zn, Au, W and Al, or an alloy consisting of two or more metals selected from the coating layer metal, is formed as an intermediate layer located between the Al electrode and the electrode coating layer consisting of Ag or Au, wherein the die electrode and the electrode coating layer or the electrode coating layers adjacent to each other are different in their metal composition.

Metals used for the intermediate layer have adhesion and diffusion barrier characteristics, which can prevent a void defect formed by a chemical compound produced by a reaction during temperature rising. For example, when forming Cr coating layer, Ni coating layer on the Al electrode and Ag coating layer on the outermost layer in order (represented by "Al/Cr/Ni/Ag"), the Cr coating layer can improve the adhesion to Al electrode surface, the Ni coating layer is capable of inhibiting formation of a chemical compound between Al and Ag by preventing diffusion, and the Ag coating layer of the outermost layer has function of preventing oxidation of the Ni coating layer surface. Likewise, it is preferable to use a combination of metals having a good adhesion and diffusion barrier characteristic, such as Al/Ti/Pd/Ag, Al/Ni/Ag, Al/TiW/Ag, Al/NiV/Ag, Al/NiV/Cu/Ag, Al/Ni/Cu/Ag, Al/Cr/Ni/Cu/Ag or Al/Zn/Pd/Ni/Ag. These structures used for the intermediate layer can be used as intermediate layer between Al electrode and the outermost surface metal to improve the reliability of bonding with Ag wire even when the outermost layer is not Ag.

Use of Ag, Au or Pd for the outermost layer of the electrode coating layer can prevent oxidation of the metal of the intermediate layer located underneath. Even when the outermost layer is Ag, if the intermediate layer includes the electrode coating layer consisting of any one metal selected from the coating layer metal except Ag or an alloy consisting of two or more metals selected from the coating layer metal, formation of the intermetallic compound from Ag layer and Al electrode can be prevented. If the electrode is a metal electrode other than Al electrode, an electrode coating layer can be a single Ag layer.

Although use of Cu electrode as a wire bonding electrode of a semiconductor die has not been studied, it is preferable to use Cu as a semiconductor electrode for the purpose of using a wire of which a main composition is Ag as a wedge bonding wire. Ag wire, compared to Cu, can significantly reduce the damage of a chip at bonding, but compared to conventional Al wire, its hardness is high. Accordingly, the probability of undergoing chip damage can be reduced if Cu electrode is applied to the bonding portion to be bonded by Ag wire instead of conventional Al electrode. In particular, the effect of reducing damage probability can be improved when the thickness of the electrode coating layer is 3 μm or more in thickness. Also in the case of bonding by Ag wire, it is preferable that an interdiffusion layer of Cu and Ag is formed with a thickness of 0.1 μm or more.

When the die electrode is Cu electrode, it is preferable to use the electrode coating layer having one or more metal layer of Au, Pd or Ni or having one or more alloy layer thereof for the purpose of preventing oxidation, which is effective and desirable for improving the bonding.

The die electrode can have a metal different from a surface electrode material under the electrode surface. For example, in the Al electrode, a surface of the electrode is an Al layer and under the surface layer, another layer having a metal different from Al, for example Cu, is formed. When Cu is used for internal wiring in the semiconductor die, if the die electrode is Al electrode, a surface of the electrode has an Al layer and under the surface layer, a layer of Cu being the same as the internal wiring in the semiconductor die is formed. Also in using Cu electrode, a surface of the electrode has a Cu layer and under the surface layer, a layer of Al, the same as the internal wiring in the semiconductor die, is formed.

In this invention, Ag wire is defined as a wire using Ag of which Ag content is 99 mass % or more, and Ag alloy wire is defined as a wire using Ag alloy of which Ag content is 50 mass % or more. Particularly Ag alloy including Au or Pd or both Au and Pd are useful. As Ag is apt to be sulfurated, an alloy including Au is effective to restrain the sulfuration. As mentioned before, Ag bonding with Al causes $Al_2Ag$ intermetallic compound formation. For preventing this problem, an alloy of Ag and Pd is effective. A content of Au is preferably not less than 1 mass % and not greater than 10 mass % and a content of Pd is preferably not less than 0.1 mass % and not greater than 5 mass %.

The diameter of the Ag or Ag alloy wire in the invention is greater than 50 μm and not greater than 2 mm since remarkable results are obtained by using a wire with a diameter greater than 50 μm. Use of a wire with a diameter not less than 150 μm is preferable and the wire with diameter not less than 200 μm is more preferable. When the diameter exceeds 2 mm, excessive ultrasonic power is required to make deformation necessary for bonding, which may lead to damaging the chip. Accordingly, an upper limit of the wire diameter is determined as 2 mm.

In the present invention, the die electrode and the connection electrode (hereinafter referred to collectively as "electrode") are connected using wedge-bonding by metal wire. Not using ball bonding but using wedge bonding for wire bonding makes it possible to secure the reliability of a bonding portion where the electrode and the wire are bonded, even when Ag or Ag alloy wire is used as the metal wire. In the case of forming a ball on Ag wire, an oxide is formed at the melting/solidification of Ag wire, even if the electrode is not made of Al, the oxide formed at the melting/solidification, among others, becomes the factor to disturb the reliability of the bonding portion. Also a heavy wire is used for applying a large amount of current to wire, however, it is difficult to form the ball stably when the wire thickness is 100 μm or more. To make a bonding of a number of thin wires provides design disadvantages and, because of above mentioned reason, makes securing the reliability questionable.

As mentioned above, formation of the electrode coating layer on the surface of die electrode provides advantages. Similar advantages are provided when the electrode coating layer is formed on the surface of the connection electrode, to be connected to the die electrode, such as an electrode on the lead frame of power semiconductor device or a metal electrode on another power semiconductor die among a plurality of power semiconductor dies being mounted.

In the power semiconductor device of the present invention, it is preferable that the Ag or Ag alloy wire is covered by a wire coating layer of which thickness is 30 Å or more, the wire coating layer contains one or more metals, an alloy including the metal, or an oxide or nitride of the metal, each of the metal is one selected from the group consisting of Pd, Au, Zn, Pt, Ni and Sn. By using the wire coating layer, the wire after resin-sealing process is prevented from chemical reaction with the wire such as sulfuration and corrosion, migration by eluted Ag ion, and diffusion of gas molecules. The thickness of the wire coating layer is preferably 50 Å or more to provide such advantages. Also if the wire is already covered by the coating layer in the previous process before the wire is connected to the semiconductor device, oxidation of the Ag wire surface before bonding can be prevented. For this purpose, the thickness of the wire coating layer is preferably not less than 50 Å and not greater than 10 μm. When the thickness is not less than 50 Å, oxidation of the surface is prevented and when the thickness is not greater than 10 μm, stability of electric resistance at the bonding portion at wire bonding can be secured.

In the power semiconductor device of the present invention, the following constitution is preferable. That is, the connection between the Ag or Ag alloy wire and the die electrode and/or the connection electrode is made by using ultrasonic waves while the temperature of either the wire or the electrode is 60° C. or more. Details are explained in the method of manufacturing of the present invention described later.

In the case of forming the wire coating layer on the wire surface of the power semiconductor device of the present invention, the coating layer can be formed before the connection is made or can be formed after the connection is made without forming the coating layer before the connection. Further, it is also possible that a thin coating layer is formed on the wire surface before the connection, and then additional coating on the wire surface is made. In the case of coating the wire surface after the connection, the coating can be made by a wet coating, dry coating or nano-particle metal depositing after the connection between the wire and the electrode is made.

In the power semiconductor device of the present invention, the power semiconductor die is preferably the die using SiC semiconductor. Since the die using SiC semiconductor is operable at high temperatures of 250° C. or more, a power semiconductor device for use at high temperature can be obtained, which achieves particularly the feature of the present invention.

The method of manufacturing the power semiconductor of the present invention is described below.

The electrode coating layer to be formed on the surface of the die electrode can be deposited by a plating method, vapor-deposition method or sputtering method.

It is preferable that the connection between the Ag or Ag alloy wire and/or the die electrode and/or the connection electrode is made by using ultrasonic waves while the temperature of either the wire or the electrode is kept at 60° C. or more. Use of ultrasonic waves provides the surface of wire with plastic deformation to reveal the newly-formed surface, which makes it possible to perform the uniform metal bonding. Keeping the temperature during bonding at 60° C. or more promotes diffusion of metal during ultrasonic-wave bonding to be able to secure the reliability of the bonding portion. Bonding performed at 120° C. or more is more preferable. However, if a temperature of 200° C. or more is applied, it becomes difficult to obtain stable bonding because of oxidation of the materials to be bonded and bonding tools and/or thermal expansion difference therebetween.

It is preferable to form the wire coating layer on the surface of the wire by a wet coating, dry coating or nano-particle metal depositing after the connection between the wire and the electrode is made. In the coating after wire bonding, the following coating methods can be used. As to the wet coating; electroplating, electroless plating, or process of heating the wire after a plating precursor solution is coated on the wire surface by electrostatic coating or the like can be used. For the electroplating or electroless plating, in addition to the way of plating by immersion in the plating solution, method of selective-plating where the plating solution is applied to only the wire by feeding the plating solution to the end of a brush to which electric voltage can be applied can be used. As to the dry coating; vapor-deposition method or sputtering method can be used. In either wet coating or dry coating, selective-coating can effectively be used by covering a no-coating-necessary portion with resist coatings or covering whole thing with resist coatings and then selectively flaking the resist from the metal-coating-necessary portion. As to nano-particle metal depositing, selective-coating by application of principle of electrostatic coating can be performed.

It is more preferable to have a coating on the surface of a wire before the connection, and further coating on the surface of the wire is made by using the above mentioned coating methods after making the connection between the wire and the electrode. By setting the thickness of the wire coating before the connection to 50 Å or more or 100 Å or less, oxidation of the surface before the connection can be effectively protected and also connectivity at the connection by the wire can be secured. When the thickness of wire coating becomes 500 Å or more by the additional coating after the wire connection, the reaction such as wire corrosion to be caused after resin sealing can be prevented and also diffusion of gas molecules can effectively be prevented.

Bonding wire to be used for the power semiconductor device of the present invention is described below.

A bonding wire of the present invention used for semiconductor connection comprises preferably an Ag or Ag alloy wire covered by a wire coating layer, wherein a diameter of the wire is greater than 50 μm and not greater than 2 mm, the wire coating layer contains one or more metals, an alloy including the metal, or an oxide or nitride of the metal, each of the metal(s) is one selected from the group consisting of Pd, Au, Zn, Pt, Ni and Sn. Reasons for the diameter size range and for the use of the Ag or Ag alloy bonding wire and the conditions for the surface coating layer are already described above.

In the bonding wire of the present invention, the thickness of the wire coating layer is preferably 1/5 (one-fifth) or less of the diameter of the wire and 10 Å or more, more preferably 1/10 (one-tenth) or less of the diameter of the wire and 50 Å or more, and furthermore preferably 1/20 (one-twentieth) or less of the diameter of the wire and 100 Å or more. As the thickness of the wire coating layer becomes thicker, probability of the damage of the chip at bonding and/or degradation of bonding quality becomes higher, while as the thickness of the coating layer becomes thinner, a probability of forming defects with the coating layer becomes higher. With regard to the chip damage, use of SiC semiconductor may lower the probability of damage because of high strength of the crystal. In the case of using Si, the probability of damage can be reduced, for example, by forming a Ni-electroless plating layer of which thickness is 3 μm or more.

The bonding wire of the present invention preferably has a diffusion layer of Ag and the metal contained in the wire coating layer between the wire coating layer and the base material of the wire, thickness of the diffusion layer is 50 Å or more and 10 μm or less. Formation of alloy by the wire coating layer and Ag the base material of the wire provides an excellent adhesion which prevents the flaking at bonding process. The advantages cannot be expected sufficiently when the thickness of diffusion layer is less than 50 Å, and if the thickness is greater than 10 μm, which contributes to an electric resistance rising which is undesirable. The thickness of the diffusion layer is more preferably 100 Å or more and 5 μm or less and furthermore preferable 100 Å or more and 2 μm or less.

Residual resistance ratio (RRR) of a wire is defined as the value obtained by dividing specific resistance at 293K by specific resistance at 4.2K. At extremely-low temperature, resistance by thermal vibration becomes extremely small. Accordingly, as resistance by lattice defect and/or impurities come to contribute to resistance value, obtaining the ratio of the value at room temperature to the value at extremely-low temperature makes it possible to obtain the value depending on the amount of the defects (lattice defect and/or impurities).

More specifically, the Residual resistance ratio (RRR) of a wire is obtained by dividing the specific resistance of the wire at room temperature (20° C.) by the specific resistance of the wire at 4.2K of the temperature of liquid helium.

In the bonding wire of the present invention, the Residual resistance ratio (RRR) of the wire is preferably not less than 5 and not greater than 2000. Although alloying the Ag wire raises the resistance value, the higher the Residual resistance ratio is, the higher the purity is. In particular the definition of purity of heavy bonding wire dealing with a large amount of current flow is preferably defined as the Residual resistance ratio, when the Residual resistance ratio is less than 5, heat generation by the resistance is increased. Residual resistance ratio (RRR) of the wire is more preferably not less than 80 and not greater than 1000, and furthermore preferably not less than 800 and not greater than 1000.

The breaking elongation of the wire is the value of $\Delta L/L \times 100(\%)$ where L is the length of original wire and $\Delta L$ is the elongation when the wire is elongated up to the breaking point. The elongation of wire $\Delta L$ can be measured by tensile tester.

In the bonding wire of the present invention, breaking elongation of the wire is preferably 15% or more. Long breaking elongation is related to the deformability of the wire, thus if the breaking elongation becomes less than 15% or less, possibility of the chip damage is increased at ultrasonic bonding process. Breaking elongation of the wire is more preferably 20% or more, and furthermore preferably 25% or more. The method of manufacturing the bonding wire of the present invention is described below.

As to the method of coating the wire, deposition can be made by using a plating method, a vapor-deposition method or a sputtering method. The wire can be manufactured by wire drawing after performing a metal coating on the original wire with a diameter of two to a hundred times heavier than its final diameter or by performing a metal coating on the wire with its final diameter. It is preferable to heat the wire after the metal coating to perform the diffusion treatment.

Measurement of thickness of the electrode coating layer on the electrode surface and the wire coating layer on the wire surface is described below. A substantial thickness of the coating layer is defined as the thickness from the outermost surface to the point where the concentration of composition(s) of the layer reaches half of that in the surface after gradually diminishing inward and toward the point. The thickness of the wire coating layer on the wire surface can be measured by, for example, AES (Auger Electron Spectroscope). Measurement of the surface coating layer is made by composition analysis in the depth direction based on composition analysis by Auger Electron Spectroscope starting from the surface. In the case of relatively thick coating layer, after grinding the cross-section, the concentration measurement can be made by performing the analysis from the surface toward the inside by Auger spectroanalysis or line analysis such as EDX and EPMA.

Example 1

The power semiconductor shown in FIG. 1 is manufactured. A chip sample is made by forming a metal electrode with 2 μm thickness as a die electrode 3 on a 10 mm square semiconductor die 2. A substrate 6 is a 50 mm square Cu substrate with 4 μm Ag plating. Si or SiC die is used for the semiconductor die 2 and an Al electrode, Cu electrode, Ni electrode or Ti electrode is used as a metal electrode. Die bonding is made between the semiconductor die 2 and the substrate 6. Table 1 represents the manufacturing condition. In the examples of the present invention, one to four electrode coating layers listed in Table 1 are formed on the surface of the die electrode 3. No. 1 layer is the undermost layer on the electrode, No. 2-No. 4 layers are formed thereon as shown in Table 1. Types of metal of the coating layer and the thickness thereof are shown in Table 1.

Figure 2:
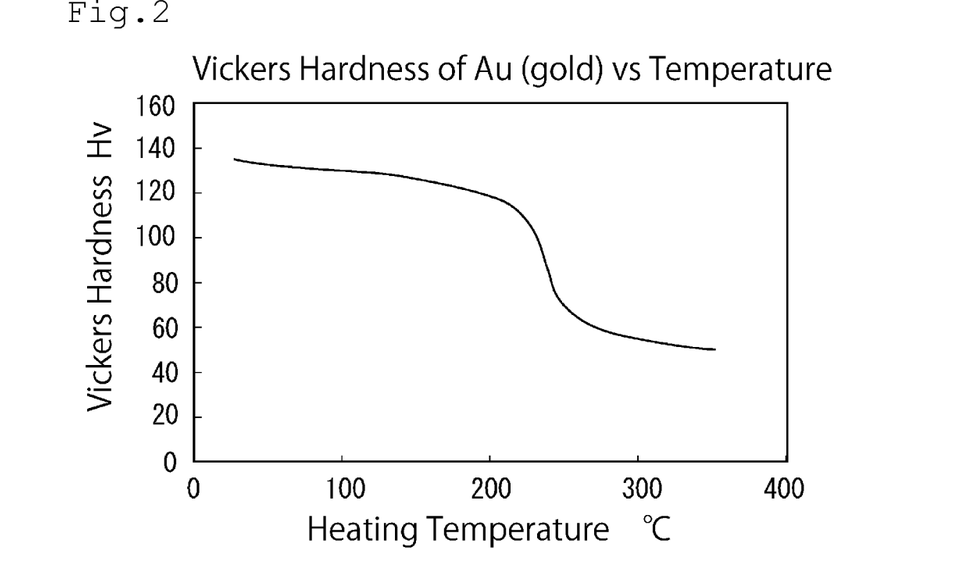
FIG. 2 is a graph showing a relationship between Vickers hardness of Au (gold) and temperature.

Ag wire with 200 μm diameter is used as metal wire 5. Types of wire and RRR (residual resistance ratio of the wire) are shown in Table 1. A wire coating layer is formed by plating a wire material with 2 mmφ with a metal to form a layer of 2-10 μm thickness. The wire coating layer of Au is formed by plating where the wire is continuously fed into the gold cyanide plating bath and rewound. Then, after undergoing the heat treatment at 250° C., the wire is drawn. As shown in FIG. 2, the hardness of Au in the wire coating layer is reduced by the heat treatment. After performing further wire drawing up to 200 μmφ, the wire undergoes again a heat treatment at 200° C. This wire is used for the bonding test.

For the bonding, commercially available wedge wire bonding machines are used to form a wedge bonding portion 7. The stage temperature is set to 100-150° C. Bonding conditions are set so that the initial shear breaking strength of the bonding portion reaches 200 gf or more. In order to test long term reliability, a heating test is performed at 200° C. for 100 hours under a nitrogen atmosphere.

Quality evaluation is described below. In the case where the initial shear strength of 200 gf or more is attained, the evaluation of the initial shear strength is "good" represented by circles (symbol: ○), and for other cases, the evaluation of the initial shear strength is "poor" represented by crosses (symbol: X). In the case where the strength after having a heating test becomes ½ (half) or less of the initial strength, the evaluation of after-heating strength change is "poor" represented by crosses (symbol: X), and for others, the evaluation of strength change after heating is "good" represented by circles (symbol: ○). Also in the case where a chip damage such as cratering is found after bonding or the cratering of chip is found at a point of flaking after a shear test, the evaluation of chip damage is "poor" represented by crosses (symbol: X), and for others, the evaluation of chip damage is "good" represented by circles (symbol: ○).

TABLE 1

| | | Semi-conductor die | Die electrode | Electrode coating layer(s) | | | | | | | |
|---|---|---|---|---|---|---|---|---|---|---|---|
| | | | | No. 1 layer | | No. 2 layer | | No. 3 layer | | No. 4 layer | |
| | No | die | electrode | type | thickness | type | thickness | type | thickness | type | thickness |
| Examples of the Invention | 1 | Si | Al | Zn | 50 Å | Ni | 3 μm | Au | 200 Å | — | — |
| | 2 | Si | Al | Zn | 50 Å | Pd | 100 Å | Ni | 3 μm | Ag | 2000 Å |
| | 3 | Si | Al | NiV | 500 Å | Pd | 100 Å | — | — | — | — |
| | 4 | Si | Al | NiV | 500 Å | Ag | 2000 Å | — | — | — | — |

TABLE 1-continued

| | | | | | | | | | | | | |
|---|---|---|---|---|---|---|---|---|---|---|---|---|
| | 5 | Si | Al | NiV | 500 Å | Cu | 1000 Å | Ag | 2000 Å | — | | |
| | 6 | Si | Al | TiW | 1000 Å | Au | 500 Å | — | | — | | |
| | 7 | Si | Al | TiW | 1000 Å | Ag | 500 Å | — | | — | | |
| | 8 | Si | Al | Zn | 50 Å | Pd | 500 Å | Ni | 5 μm | Au | 200 Å | |
| | 9 | Si | Al | Zn | 50 Å | Pd | 500 Å | Ni | 5 μm | Au | 200 Å | |
| | 10 | Si | Al | Zn | 50 Å | Ni | 3 μm | Au | 200 Å | — | | |
| | 11 | Si | Al | Ti | 3000 Å | Ni | 3000 Å | Au | 500 Å | — | | |
| | 12 | Si | Al | Ti | 3000 Å | Pd | 3000 Å | Ag | 1000 Å | — | | |
| | 13 | Si | Al | Ni | 3000 Å | Ag | 1000 Å | — | | — | | |
| | 14 | Si | Ti | Ni | 3000 Å | Ag | 1000 Å | — | | — | | |
| | 15 | Si | Al | Ni | 3000 Å | Cu | 3000 Å | Ag | 1000 Å | — | | |
| | 16 | Si | Al | Cr | 500 Å | Ni | 1000 Å | Cu | 3000 Å | — | | 1000 Å |
| | 17 | Si | Al | Cr | 500 Å | Ni | 1000 Å | Au | 1000 Å | — | | |
| | 18 | Si | Al | Ti | 3000 Å | Pd | 3000 Å | — | | — | | |
| | 19 | Si | Cu | Pd | 1000 Å | — | | — | | — | | |
| | 20 | Si | Cu | Al | 3000 Å | TiW | 1000 Å | Au | 500 Å | — | | |
| | 21 | SiC | Ni | Ag | 1 μm | Au | 500 Å | — | | — | | |
| | 22 | SiC | Ni | Ag | 1 μm | Au | 500 Å | — | | — | | |
| | 23 | SiC | Ti | Ni | 3000 Å | Au | 1000 Å | — | | — | | |
| | 24 | SiC | Ni | Ag | 1 μm | — | | — | | — | | |
| Comparative Examples | 1 | Si | Al | — | | — | | — | | — | | |
| | 2 | Si | Al | — | | — | | — | | — | | |
| | 3 | Si | Al | — | | — | | — | | — | | |
| | 4 | SiC | Ni | Ag | 1 μm | Au | 500 Å | — | | — | | |

| | | Wire | | | Wire coating layer | | Strength | | Chip damage |
|---|---|---|---|---|---|---|---|---|---|
| | No | type | RRR | Breaking elongation (%) | type | thickness | Initial shear strength | change after heating | |
| Examples of the Invention | 1 | Ag | 800 | 23 | Pd | 1 μm | o | o | o |
| | 2 | Ag | 800 | 20 | Pd | 1 μm | o | o | o |
| | 3 | Ag | 800 | 20 | Au | 500 Å | o | o | o |
| | 4 | Ag | 800 | 20 | Au | 2000 Å | o | o | o |
| | 5 | Ag | 800 | 20 | Au | 500 Å | o | o | o |
| | 6 | Ag | 800 | 25 | — | | o | o | o |
| | 7 | Ag | 800 | 25 | Au | 1 μm | o | o | o |
| | 8 | Ag (Pd added dilute alloy) | 40 | 18 | Au | 100 Å | o | o | o |
| | 9 | Ag (Pd added dilute alloy) | 40 | 18 | ZnO | 100 Å | o | o | o |
| | 10 | Ag | 800 | 23 | Zn | 1 μm | o | o | o |
| | 11 | Ag | 1000 | 25 | — | | o | o | o |
| | 12 | Ag | 1000 | 30 | Pd | 10 μm | o | o | o |
| | 13 | Ag | 1000 | 30 | Ni | 100 Å | o | o | o |
| | 14 | Ag | 1000 | 30 | — | | o | o | o |
| | 15 | Ag | 1000 | 30 | — | | o | o | o |
| | 16 | Ag | 1000 | 30 | Pt | 200 Å | o | o | o |
| | 17 | Ag | 1000 | 30 | — | | o | o | o |
| | 18 | Ag | 1000 | 30 | — | | o | o | o |
| | 19 | Ag | 800 | 25 | — | | o | o | o |
| | 20 | Ag | 800 | 25 | — | | o | o | o |
| | 21 | Ag | 80 | 17 | — | | o | o | o |
| | 22 | Ag | 80 | 15 | — | | o | o | o |
| | 23 | Ag | 1000 | 25 | — | | o | o | o |
| | 24 | Ag (Au alloying) | 5 | 17 | — | | o | o | o |
| Comparative Examples | 1 | Ag | 800 | 20 | — | | o | x | o |
| | 2 | Ag | 3 | 8 | — | | x | x | x |
| | 3 | Cu | 100 | 20 | — | | o | o | x |
| | 4 | Ag | 80 | 14 | — | | o | o | x |

In the example of the invention, there is no damage at the bonding and no degradation of shear strength after the heating test. Evaluation is based on an average of ten measurements.

In contrast, in the comparative example, at least one of the qualities is poor because the electrode coating layer is not formed on the metal electrode. When the change in color of the Ag wire part is examined after keeping the bonding test samples in the example of the invention for 30 days at room temperature, no color change is observed with regard to the wire covered by the coating including clear ZnO film. With regard to non-coating high purity Ag wire, a slight blackening is observed. With regard to the Au alloying wire, a color change is hardly observed.

The wire coating is applied on a heavy wire by plating or vapor-deposition, then the coated wire is drawn to a final wire diameter. Regarding the oxide coating, the wire with the final diameter is coated by using wet coating. Although not used in the bonding test, the wire having final wire diameter on which a 20 Å in average Au coating is formed is observed after keeping for 30 days. Color change is found. According to the surface analysis, it is found that blackening of the surface is caused by Ag sulfide or Ag oxide on the surface.

Example 2

A test is performed under a similar condition as example 1 except that the wire diameter is changed from 200 μmϕ to 500 μmϕ. The manufacturing condition and the result is shown in Table 2. Evaluation in example 2 is made in a similar way to example 1. In the case where the initial shear strength of 500 gf or more is attained, the evaluation of the initial shear strength is "good" represented by circles (symbol: ○), and for other cases, the evaluation of the initial shear strength is "poor" represented by crosses (symbol: X). Same as example 1, any of examples of the invention shows good results.

TABLE 2

|  |  | Semi-conductor die | Die electrode | Electrode coating layer(s) | | | | | | |
|---|---|---|---|---|---|---|---|---|---|---|
|  |  |  |  | No. 1 layer | | No. 2 layer | | No. 3 layer | | No. 4 layer | |
|  | No |  |  | type | thickness | type | thickness | type | thickness | type | thickness |
| Examples of the Invention | 25 | Si | Al | Zn | 50 Å | Ni | 5 μm | Au | 200 Å | — | |
|  | 26 | Si | Al | NiV | 500 Å | Pd | 100 Å | — | | — | |
|  | 27 | Si | Al | TiW | 1000 Å | Au | 500 Å | — | | — | |

|  |  | Wire | | | Wire coating layer | | Strength | | |
|---|---|---|---|---|---|---|---|---|---|
|  |  |  |  | Breaking elongation |  |  | Initial shear | change after | Chip |
|  | No | type | RRR | (%) | type | thickness | strength | heating | damage |
| Examples of the Invention | 25 | Ag | 800 | 31 | Pd | 2.5 μm | ○ | ○ | ○ |
|  | 26 | Ag | 800 | 31 | Au | 1500 Å | ○ | ○ | ○ |
|  | 27 | Ag | 800 | 35 | — | — | ○ | ○ | ○ |

The present invention can be used for a power semiconductor device and method of manufacturing the same.

DESCRIPTION OF REFERENCE NUMBERS

1: power semiconductor device, 2: power semiconductor die, 3: die electrode, 4: connection electrode, 5: metal wire, 6: substrate, 7: wedge bonding portion

What is claimed is:

1. A power semiconductor device comprising:
a power semiconductor die,
a metal electrode on the power semiconductor die (hereinafter referred to as a die electrode); and
another metal electrode to be connected to the die electrode (hereinafter referred to as a connection electrode),
wherein the die electrode and the connection electrode are connected with a metal wire by a wedge bonding connection;
wherein the metal wire is Ag or Ag alloy wire of which diameter is greater than 50 μm and not greater than 2 mm and the die electrode has thereon one or more layers (hereinafter referred to as electrode coating layer(s)), each of the layer(s) being 50 Å or more in thickness consists of any one metal or an alloy made of two or more metals selected from the group consisting of Ni, Cr, Cu, Pd, V, Ti, Pt, Zn, Ag, Au, W and Al (hereinafter referred to as coating layer metal),
wherein the die electrode and the electrode coating layer or the electrode coating layers adjacent to each other are different in their metal composition; wherein in the case where the die electrode is an Al electrode and an outermost surface layer of the electrode coating layer(s) is made of Ag, the die electrode has thereon, under the outermost surface layer of the electrode coating layer(s), one or more electrode coating layers each of which consists of any one metal selected from the coating layer metal except Ag or any alloy consisting of two or more metals selected from the coating layer metal, wherein the die electrode and the electrode coating layer or the electrode coating layers adjacent to each other are different in their metal composition.

2. A power semiconductor device according to claim 1, wherein the Ag or Ag alloy wire is covered by a wire coating layer of which thickness is 30 Å or more, the wire coating layer contains one or more metals, an alloy including the metal, or an oxide or nitride of the metal, and each of the metal(s) is one selected from the group consisting of Pd, Au, Zn, Pt, Ni and Sn.

3. A power semiconductor device according to claim 1, wherein connection between the Ag or Ag alloy wire and the die electrode and/or the connection electrode is made by using ultrasonic waves while temperature of either the wire or the electrode is kept at 60° C. or more.

4. A power semiconductor device according to claim 2, wherein the wire coating layer on the surface of the wire is formed by a wet coating, a dry coating or a nano-particle metal depositing after the wire and the electrode are bonded.

5. A power semiconductor device according to claim 1, wherein the power semiconductor die uses a SiC semiconductor.

6. A method of manufacturing a power semiconductor device according to claim 1, comprising:
making a connection between the Ag or Ag alloy wire and the die electrode and/or the connection electrode by using ultrasonic waves while keeping temperature of either the wire or the electrode at 60° C. or more.

7. A method of manufacturing a power semiconductor device according to claim 2 comprising:
forming the wire coating layer on the surface of the wire by a wet coating, a dry coating or a nano-particle metal depositing after the wire and the electrode are bonded.

8. A bonding wire for semiconductor connection comprising:
an Ag or Ag alloy wire covered by a wire coating layer,
wherein a diameter of the wire is greater than 50 μm and not greater than 2 mm, the wire coating layer contains one or more metals, an alloy including the metal, or an oxide or nitride of the metal, and each of the metal(s) is one selected from the group consisting of Pd, Au, Zn, Pt, Ni and Sn.

9. A bonding wire according to claim 8,
wherein a thickness of the wire coating layer is ⅕ (one-fifth) or less of the diameter of the wire and 10 Å or more.

10. A bonding wire according to claim 8, further comprising a diffusion layer of Ag and a metal contained in the wire coating layer between the wire coating layer and a base material of the wire, a thickness of the diffusion layer is 50 Å or more and 10 μm or less.

11. A bonding wire according to claim 8,
wherein a residual resistance ratio of the bonding layer is 5 or more and 2000 or less.

12. A bonding wire according to claim 8,
wherein a breaking elongation of the bonding wire is 15% or more.

13. A power semiconductor device according to claim 2,
wherein connection between the Ag or Ag alloy wire and the die electrode and/or the connection electrode is made by using ultrasonic waves while temperature of either the wire or the electrode is kept at 60° C. or more.

14. A power semiconductor device according to claim 2,
wherein the power semiconductor die uses a SiC semiconductor.

15. A power semiconductor device according to claim 3,
wherein the power semiconductor die uses a SiC semiconductor.

16. A power semiconductor device according to claim 4,
wherein the power semiconductor die uses a SiC semiconductor.

17. A method of manufacturing a power semiconductor device according to claim 2, comprising:
making a connection between the Ag or Ag alloy wire and the die electrode and/or the connection electrode by using ultrasonic waves while keeping temperature of either the wire or the electrode at 60° C. or more.

18. A bonding wire according to claim 9, further comprising a diffusion layer of Ag and a metal contained in the wire coating layer between the wire coating layer and a base material of the wire, a thickness of the diffusion layer is 50 Å or more and 10 μm or less.

19. A bonding wire according to claim 9,
wherein a residual resistance ratio of the bonding layer is 5 or more and 2000 or less.

20. A bonding wire according to claim 10,
wherein a residual resistance ratio of the bonding layer is 5 or more and 2000 or less.

21. A bonding wire according to claim 9,
wherein a breaking elongation of the bonding wire is 15% or more.

22. A bonding wire according to claim 10,
wherein a breaking elongation of the bonding wire is 15% or more.

23. A bonding wire according to claim 11,
wherein a breaking elongation of the bonding wire is 15% or more.

24. A power semiconductor device comprising:
a power semiconductor die,
a metal electrode on the power semiconductor die (hereinafter referred to as a die electrode); and
another metal electrode to be connected to the die electrode (hereinafter referred to as a connection electrode),
wherein the die electrode and the connection electrode are connected with a metal wire by a wedge bonding connection;
wherein the metal wire is Ag or Ag alloy wire of which diameter is greater than 50 μm and not greater than 2 mm and the die electrode has thereon one or more layers (hereinafter referred to as electrode coating layer(s)), each of the layer(s) being 50 Å or more in thickness comprising any one metal or an alloy made of two or more metals selected from the group consisting of Ni, Cr, Cu, Pd, V, Ti, Pt, Zn, Ag, Au, W and Al (hereinafter referred to as coating layer metal),
wherein the die electrode and the electrode coating layer or the electrode coating layers adjacent to each other are different in their metal composition; wherein in the case where the die electrode is an Al electrode and an outermost surface layer of the electrode coating layer(s) is made of Ag, the die electrode has thereon, under the outermost surface layer of the electrode coating layer(s), one or more electrode coating layers each of which comprises any one metal selected from the coating layer metal except Ag or any alloy comprising of two or more metals selected from the coating layer metal, wherein the die electrode and the electrode coating layer or the electrode coating layers adjacent to each other are different in their metal composition.

* * * * *